(12) United States Patent
Ramm et al.

(10) Patent No.: US 12,721,131 B2
(45) Date of Patent: Aug. 25, 2026

(54) CRYO-COMPATIBLE QUANTUM COMPUTING ARRANGEMENT AND METHOD FOR PRODUCING A CRYO-COMPATIBLE QUANTUM COMPUTING ARRANGEMENT

(71) Applicant: Fraunhofer-Gesellschaft zur Förderung der angewandten Forschung e.V., Munich (DE)

(72) Inventors: Peter Ramm, Munich (DE); Josef Weber, Munich (DE); Armin Klumpp, Munich (DE)

(73) Assignee: FRAUNHOFER-GESELLSCHAFT ZUR FÖRDERUNG DER ANGEWANDTEN FORSCHUNG E.V., Munich (DE)

( * ) Notice: Subject to any disclaimer, the term of this patent is extended or adjusted under 35 U.S.C. 154(b) by 752 days.

(21) Appl. No.: 17/814,662

(22) Filed: Jul. 25, 2022

(65) Prior Publication Data

US 2023/0043673 A1 Feb. 9, 2023

(30) Foreign Application Priority Data

Aug. 3, 2021 (EP) .................................... 21189507
Sep. 16, 2021 (EP) .................................... 21197281

(51) Int. Cl.
*H10W 20/20* (2026.01)
*G06N 10/40* (2022.01)
(Continued)

(52) U.S. Cl.
CPC ............ *H10W 20/20* (2026.01); *G06N 10/40* (2022.01); *H10W 20/023* (2026.01);
(Continued)

(58) Field of Classification Search
CPC . H01L 23/481; H01L 21/76898; H01L 24/05; H01L 24/06; H01L 24/13;
(Continued)

(56) References Cited

U.S. PATENT DOCUMENTS 6,548,391 B1 4/2003 Ramm et al.
8,525,343 B2 9/2013 Yu et al.
(Continued)

FOREIGN PATENT DOCUMENTS

CN 104011858 A 8/2014
CN 112602205 A 4/2021
(Continued)

OTHER PUBLICATIONS

S. Basavaiah, S. R. Pollack; Superconductivity in β-Tungsten Films. J. Appl. Phys. Nov. 1, 1968; 39 (12): 5548-5556. (Year: 1968).*
(Continued)

*Primary Examiner* — Fernando L Toledo
*Assistant Examiner* — Ryan T. Fortin
(74) *Attorney, Agent, or Firm* — McClure, Qualey & Rodack, LLP

(57) ABSTRACT

A cryo-compatible quantum computing arrangement includes a computing component having a substrate structure, a plurality of first contact elements and a plurality of conductive feedthroughs through the substrate structure, wherein the conductive feedthroughs are electrically connected on a first main surface area of the substrate structure to first contact elements of the microelectronic quantum computing component, and a further microelectronic component having second contact elements, wherein on a second main surface area, the conductive feedthroughs are electrically connected to second contact elements of the further microelectronic component, and wherein the conductive feedthroughs each include, between the first and second
(Continued)

contact elements, a layer element including a first material that is superconducting at a quantum computing operating temperature, and a filling element including a second material that is electrically conductive.

23 Claims, 4 Drawing Sheets

(51) Int. Cl.
*H10W 20/00* (2026.01)
*H10W 72/20* (2026.01)
*H10W 72/90* (2026.01)

(52) U.S. Cl.
CPC ........ *H10W 72/244* (2026.01); *H10W 72/248* (2026.01); *H10W 72/9226* (2026.01); *H10W 72/923* (2026.01); *H10W 72/924* (2026.01); *H10W 72/926* (2026.01); *H10W 72/942* (2026.01); *H10W 72/944* (2026.01); *H10W 72/952* (2026.01)

(58) Field of Classification Search
CPC ........... H01L 24/14; H01L 2224/05009; H01L 2224/05184; H01L 2224/05186; G06N 10/40; H10N 60/81; H10N 60/815; H10N 60/82
See application file for complete search history.

(56) References Cited

U.S. PATENT DOCUMENTS

| | | | | |
|---|---|---|---|---|
| 2018/0013052 | A1* | 1/2018 | Oliver | H10N 60/805 |
| 2018/0102469 | A1 | 4/2018 | Das et al. | |
| 2018/0247974 | A1 | 8/2018 | Oliver | |
| 2019/0305037 | A1 | 10/2019 | Michalak | |
| 2020/0152854 | A1 | 5/2020 | Sandberg et al. | |

FOREIGN PATENT DOCUMENTS

| | | | |
|---|---|---|---|
| EP | 2 876 435 | B1 | 1/2019 |
| EP | 4131086 | A1 | 2/2023 |
| TW | 201828472 | A | 8/2018 |
| TW | I852051 | B | 8/2024 |
| WO | 2017015432 | A1 | 1/2017 |
| WO | 2017/051432 | A1 | 3/2017 |
| WO | 2017/079417 | A1 | 5/2017 |
| WO | 2018/063170 | A1 | 4/2018 |
| WO | 2019032115 | A1 | 2/2019 |

OTHER PUBLICATIONS

Yost, D. R. W.,et al.; "Solid-state qubits integrated with superconducting through-silicon vias;" NPJ, Quantum Information; 2020; pp. 1-7.

Grigoras, K., et al.; "Superconducting TiN through-silicon-vias for quantum technology;" VTT Technical Research Centre of Finland Ltd; IEEE 2019; 21st Electronics Packaging Technology Conference; pp. 81-82.

Tao, J., et al.; "3D Integration of CMOS-Compatible Surface Electrode Ion Trap and Silicon Photonics for Scalable Quantum Computing;" 2019 IEEE 69th Electronic Components and Technology Conference (ECTC); 2019, pp. 1735-1743.

Lita, A.E., et al.; "Tuning of Tungsten Thin Film Superconducting Transition Temperature for Fabrication of Photon Number Resolving Detectors;" IEEE Transactions on Applied Superconductivity, vol. 15, No. 2, Jun. 2005; pp. 3528-3531.

MSE Supplies; "Coefficients of Linear Thermal Expansion—Silver CTE;" pp. 1.

Chinese language office action dated May 15, 2023, issued in application No. TW 111128396.

English language translation of office action dated May 15, 2023 (pp. 1-5 of attachment).

Chinese language office action dated Jan. 31, 2026, issued in application No. CN 202210926685.7 (English language translation, pp. 1-8 of attachment).

Chinese language office action dated Aug. 28, 2025, issued in application No. TW 113125969 (English language translation, pp. 1-3 of attachment).

Korean language office action dated May 19, 2025, issued in application No. KR 10-2022-0092483 (English language translation, pp. 9-16 of attachment).

Korean language office action dated Aug. 1, 2025, issued in application No. KR 10-2022-0092483 (English language translation, pp. 1-7 of attachment).

* cited by examiner

CRYO-COMPATIBLE QUANTUM COMPUTING ARRANGEMENT AND METHOD FOR PRODUCING A CRYO-COMPATIBLE QUANTUM COMPUTING ARRANGEMENT

CROSS-REFERENCE TO RELATED APPLICATIONS

This application claims priority from European Patent Application No. 21189507.3, which was filed on Aug. 3, 2021 and European Patent Application No. 21197281.5, which was filed on Sep. 16, 2021, and is incorporated herein in its entirety by reference.

The present invention relates to a cryo-compatible arrangement of microelectrical components and a method for producing a cryo-compatible arrangement for quantum computing applications. The cryo-compatible connection is characterized by the fact that the same can be used to pretest the circuits already at room temperature ($R_T$=room temperature) or down to about −70° C. or at about −70° C. (test mode) and then, when cooling down, the same transitions into the superconducting state in the cryo-temperature range (operating mode). Further, the present invention relates to a three-dimensional integrated structure for controlling ions (ion qubits) in an ion trap on a chip (ion trap chip) and an approach for cryo-compatible vertical system integration of heterogeneous microelectronic components for quantum computing applications.

BACKGROUND OF THE INVENTION

For the quantum computer or for quantum computing, ions, or ion qubits or qubits, are integrated with suitable control/readout systems using wiring techniques. For the needed cryo-compatible integration methods or integrated structures, conventional solder connections are used as they allow low-temperature processing without degradation of qubits, for example superconducting transmons (type of superconducting charge qubit) based on Josephson junctions. However, these conventionally used solders do not meet the requirements of high I/O counts and high wiring densities with at the same time minimum stand-off distances. Therefore, in future, the focus will be on scaling or scalability of the quantum computing components.

SUMMARY

According to an embodiment, a cryo-compatible quantum computing arrangement may have: a microelectronic quantum computing component having: a substrate structure, a plurality of first contact elements and a plurality of conductive feedthroughs through the substrate structure, wherein the conductive feedthroughs on a first main surface area of the substrate structure are electrically connected to associated first contact elements of the microelectronic quantum computing component, and a further microelectronic component comprising a plurality of second contact elements, wherein, on a second main surface area of the substrate structure, the conductive feedthroughs are electrically connected to associated second contact elements of the further microelectronic component, and wherein the conductive feedthroughs each comprise, between the first contact element and the second contact element, a layer element comprising a first material that is superconducting at a quantum computer operating temperature and a filling element comprising a second material that is electrically conductive.

According to another embodiment, a method for providing a cryo-compatible quantum computing arrangement may have the steps of: providing a microelectronic quantum computing component comprising a substrate structure, a plurality of first contact elements and a plurality of conductive feedthroughs through the substrate structure, wherein the conductive feedthroughs each comprise a layer element comprising a first material that is superconducting at a quantum computing operating temperature and a filling element comprising a second material that is electrically conductive, forming an electrical connection between the conductive feedthroughs on a first main surface area of the substrate structure and the associated first contact elements of the microelectronic quantum computing component, providing a further microelectronic component comprising a plurality of second contact elements, and forming a further electrical connection on a second main surface area of the substrate structure between the conductive feedthroughs with associated second contact elements and the further microelectronic component.

A core idea of embodiments of the present invention is to provide a cryo-compatible quantum computing arrangement in which the interconnects and/or feedthroughs, e.g. TSVs, of the vertically integrated arrangement of heterogeneous microelectronic components each comprise, between a first and a second contact element, a layer element having a first material that is superconducting at a quantum computing operating temperature and a filling element having a second material that is electrically conductive. This is true of some metallic compounds, as long as the temperature is low enough (e.g., in the mK range). However, there are crystal modifications which already transition to the superconducting state at higher temperatures. This is the case, for example, with the β-tungsten modification. To take advantage of the β-modification of tungsten, the integrated wiring in the TSVs, for example, comprises a layer structure with titanium nitride and tungsten, for example. Titanium nitride itself also becomes superconducting at low temperatures (approx. 1.6 K).

According to an embodiment, the filling element fills at least 50% (or at least 70, 90 or 99%) of the respective volume of the conductive feedthroughs along the cross-section between the first and second main surface areas of the substrate structure. The filling element can also completely fill the respective volume (=residual volume of the feedthroughs provided with the layer element).

However, according to the inventive approach, by using the combination of an integrated wiring, the microelectrical components for the quantum computing applications are controlled by means of a 3D TSV technology (TSV=Through Silicon Via), wherein the conductive TSV feedthroughs are at least partially or completely filled with a layer structure of electrically conductive material and further a material that is superconducting at quantum computing operating temperature. In order to take advantage of the β-modification of tungsten, the integrated wiring in the TSVs comprises, for example, the layer structure having, e.g., a superconducting material such as titanium nitride (or with another superconducting material) and an electrically conducting material such as tungsten or a tungsten-based material (or with another electrically conducting material).

An embodiment according to the present invention includes a cryo-compatible quantum computing arrangement, for example a three-dimensional structure for controlling ion trap qubits in an ion trap chip, for example for operation in the cryo-temperature range, having a microelectrical quantum computing component and another microelectrical component. The microelectrical quantum computing component includes a substrate structure, for example of silicon and/or silicon dioxide, with a plurality of first contact elements and a plurality of conductive feedthroughs, for example through silicon vias (TSVs), through the substrate structure.

According to an embodiment of the present invention, the filling element fills the conductive feedthroughs each at least partially or also completely with an electrically conductive material, such as tungsten. For example, the filling element can also comprise an electrically conductive material such as niobium (Ni), tantalum (Ta), titanium nitride (TiN), platinum (Pt), palladium (Pd), nickel (Ni), copper (Cu), aluminum (Al), titanium (Ti), or lead (Pb), or an electrically conductive alloy.

By filling the conductive feedthroughs (TSVs) at least partially or even completely (except for the superconducting layer element) with the electrically conductive filling element, such as tungsten, high conductivity of the TSVs can already be provided at relatively high temperatures (in the cryogenic temperature range) above the superconductivity transition temperature, compared to, for example, titanium nitride-metallized TSVs. Thus, a relatively easy testability of the microelectronic components can be obtained and the functionality of the same can be tested even before the microelectronic components are used at the application temperatures below the transition temperature for superconductivity. Due to the high conductivity of the tungsten-filled feedthroughs (TSVs), a reliable functional test can already be performed in a temperature range around 70° K (nitrogen temperature), i.e. below the boiling point of nitrogen at 77.4 K (−195.8° C.).

The TSVs, which are at least partially filled, for example, can be filled, on average, by at least 20%, 50%, 70% or 90%, or even completely with the electrically conductive material, such as tungsten. The greater the degree of filling of the TSVs with tungsten, the higher the conductivity of the TSVs at temperatures above the superconductivity transition temperature.

In general, cryogenics covers the temperature range below −150° C., for example. Accordingly, technically accessible are temperatures of below 77.4 K (−195.8° C.), the boiling point of nitrogen, 20.4 K (for example by means of hydrogen), and 4.2 K (for example by means of helium). Lower temperatures in the cryogenic temperature range can be achieved, for example, by reducing the pressure and thus changing the boiling points. Above that, it is possible to achieve a temperature of about 1 K by means of helium. To be able to achieve correspondingly lower temperatures, for example about 1 mK, a comparatively expensive isotope 3He or a helium mixture is used. Due to the fact that copper does not become superconducting in any temperature range, the conductive feedthroughs (TSVs) are filled with the layer element, which is superconducting at a quantum computer operating temperature, and with the filling element, which is electrically conductive, so that a correspondingly high electrical conductivity can be provided both within the cryogenic temperature ranges and outside the cryogenic temperature ranges.

The layer element can comprise, for example, one or more of the following materials: tungsten, technetium, tantalum, niobium, $Nb_3Ge$, MoN, $MgB_2$, $K_3C_{60}$, gallium, lead, AuPb, aluminum, (and following metallic nitrides) TiN, ZrN, HfN, VN, NbN, TaN, MoN, WN. Of these, NbN has the highest transition temperature with $T_c$~17K, while TiN has a transition temperature $T_c$~4.8K.

The test mode of the quantum computing arrangement comprises, for example, a temperature range at room temperature from, e.g., 295.15 K (at 22° C.) to, e.g., 203.15 K (−70° C.). The cooling mode of the quantum computing arrangement comprises, for example, a temperature range from the corresponding 203.15 K (−70° C.) to correspondingly 10 K (−263.15° C.). In other words, during the cooling mode, the temperature of the quantum computing arrangement is cooled down from room temperature or the temperature of the test mode to operating temperature, corresponding to the operating mode of the quantum computing arrangement. For example, the operating mode includes a temperature range below 10 K or starting or partially overlapping from 10 K (−263.15° C.) to, e.g., 0.001 K (−273.149° C.).

In summary, then, the test mode of the cryo-compatible quantum computing arrangement is performed in a temperature range that can be set with relatively little effort, where the high electrical conductivity of the filling material of the conductive feedthroughs is utilized, while the operating mode is in the cryo-temperature range, where the superconductivity of the layer element of the conductive feedthroughs is utilized.

According to an embodiment of the present invention, the layer element can comprise a beta-modification of tungsten, wherein the filling element comprises an electrically conductive material, such as tungsten or a tungsten-based material or another electrically conductive material. According to another embodiment of the present invention, the layer element can comprise a beta-modification of tungsten, wherein the filling element comprises a tungsten material. Tungsten becomes superconducting at a temperature of about 0.015 K (15 mK) and below, while the beta-tungsten modification becomes superconducting already at a temperature of about 4 K and below. Titanium nitride itself also becomes superconducting at low temperatures (about 1.6 K). Further, the layer element can include a niobium material, a titanium nitride material, and a tantalum material. Thus, the superconductivity of the stated materials is achieved in the operating mode of the quantum computing arrangement.

To maintain the β-modification of tungsten during production, TSVs are filled with a layer stack that puts the tungsten under permanent compressive stress. For example, to maintain the beta-modification of the tungsten of the layer element, the tungsten can be arranged as a layer in the conductive feedthroughs of the substrate, wherein, adjacent to the layer element of beta-tungsten material, for example, another layer of another material having a higher coefficient of thermal expansion than the tungsten material can be arranged. This is the case, for example, when tungsten is used with an adjacent titanium nitride layer (as the further layer) or between titanium nitride layers (as the further layers).

According to a further embodiment, the layer stack can also comprise niobium (as a layer element) with an adjacent titanium nitride layer (as the further layer) or can be arranged between titanium nitride layers (as the further layers) or can comprise tantalum (as layer element) with an adjacent titanium nitride layer (as the further layer) or can be arranged between titanium nitride layers (as the further layers). For example, the further layer(s) can comprise tungsten disulfide (WS2), platinum (Pt), palladium (Pd), nickel (Ni), aluminum (Al) and/or aluminum oxide (Al2O3) apart from (=instead of) titanium nitride (TiN). Here, the layer thicknesses of the layer stack and the filling element can at least partially fill the via and together correspond to the cross-section of the via. Using the inventive method, which will be explained in the description below, for example, both the aforementioned layer stack and the tungsten can be deposited into the via.

The conductive feedthroughs (TSVs) are electrically connected to associated first contact elements of the microelectrical quantum computing component on a first main surface area of the substrate structure. For example, each individual feedthrough of the microelectrical quantum computing component is associated with a respective first contact element. In other words, each individual conductive feedthrough on the first main surface of the substrate structure can be associated with and electrically connected to a first contact element. The further microelectrical component includes a plurality of second contact elements associated with and electrically connected to the conductive feedthroughs (TSVs) on a second main surface area of the substrate structure of the microelectrical quantum computing component. Thus, an electrical connection is provided from the first contact elements of the microelectronic quantum computing component to the second contact elements of the further microelectrical component.

According to a further embodiment, the contact elements are formed as bond bumps or bond pillars. In other words, the contact elements serving as electrical connection between the microelectrical quantum computing component and the further microelectrical component can comprise, for example, a corresponding spherical or columnar shape and an angular (e.g. rectangular), round (e.g. circular) and/or elliptical cross-sectional shape, although this list is not to be considered as exhaustive. In addition, depending on the requirements, it is possible to form the electrical connection as a bump and to obtain the same by means of adhesion, for example, by depositing an adhesive material between the contact elements and the microelectrical component.

According to another embodiment, the contact connection, for example the electrical connection of the conductive feedthroughs, between the contact elements of the microelectrical quantum computing component can comprise a cryo-compatible interdiffusion metallic connection.

According to a further embodiment, the contact elements on the second main surface area of the substrate structure comprise interdiffusion metallic connections with the contact elements of the further microelectrical component. By having cryo-compatible interdiffusion metallic connections between the TSVs and the correspondingly associated first contact elements and/or second contact elements on the first main surface area of the substrate structure and on the second main surface area of the substrate structure, a correspondingly stable electrical connection can be provided so that superconductivity can be realized from cryo-compatible materials at the application temperatures of quantum computing, for example in the range of 10-1000 mK.

Embodiments provide an arrangement in which the contact elements of the microelectronic quantum computing component are connected to a plurality of TSVs in a parallel circuit, for example for resistance reduction. For example, by connecting at least a part of the arrangement in parallel, a resulting resistance (conductance) can be set, i.e., by a defined number of TSVs connected in parallel, the resulting resistance can be adjusted or reduced accordingly depending on the application.

According to a further embodiment, the plurality of conductive feedthroughs (TSVs) is electrically insulated from the substrate structure by means of an insulation material, for example on the sidewalls of the feedthroughs, for example by arranging a dielectric material, for example a dielectric, between the substrate structure and the TSV. For example, the insulating material and optionally also the tungsten-based layer sequence can be deposited on the sidewalls of the TSVs using the inventive production process, so that an interdiffusion metallic connection can be formed, for example.

Another embodiment according to the present invention includes conductive feedthroughs (TSVs) having a diameter in the range of 0.8 μm to 1.5 μm. Further, the TSVs can have a minimum TSV spacing from each other that includes a range of 1.6 μm to 3 μm. For example, the TSV depth into the substrate can be at least 6 μm to 10 μm. Further, the conductive feedthrough can have an aspect ratio of 10:1 to 20:1 to obtain the highest possible integration density in the substrate so that the high wiring density can control a high number of qubits.

Further, an embodiment according to the present invention comprises a method for producing a cryo-compatible quantum computing arrangement, for example, for operation in the cryo-temperature range. For example, the method comprises providing the substrate structure with a plurality of first contact elements. Further, the method comprises forming conductive vias (TSVs), for example, using Bosch etching, DRIE, or a wet etching process. Further, the method can comprise depositing an insulating layer or insulating material, for example, onto the sidewalls of the feedthroughs. For example, the insulating material can comprise silicon dioxide and can be deposited onto the sidewalls of the conductive feedthroughs using plasma-enhanced chemical vapor deposition (PECVD). Further, the method can comprise filling by using the chemical vapor deposition (PVD) process to fill or deposit the TSVs with tungsten material into the conductive via. Further, the method can comprise chemical mechanical polishing (CMP) to remove impurities on the microelectrical quantum computing component. Further, the method comprises contacting the first contact elements with the tungsten material filled via and the plurality of second contact elements such that a three-dimensional structure for controlling ion trap qubits can be provided for operation in the cryogenic temperature range.

For example, the process can be used to provide a cryo-compatible intermetallic bond with high integration density of the TSVs, based on metal interdiffusion methods and/or based on solid-liquid diffusion (SLID) processes, so that the number of controlled ion trap qubits can be increased, for example by more than two orders of magnitude. Advantageously, the use of this method is excellently suited for the scaling needed in quantum computers.

Further, embodiments allow the method to use a metal interdiffusion method, for example based on the Nb/TiN/Au metal system, to produce or obtain a common layer of two different types of atoms from formerly separate regions into each other. For example, the atoms of the first contact element and the atoms of the tungsten material can combine by diffusion to compensate for concentration differences in the materials. Through this, it was realized that the integration density in the substrate structure can be increased, so that the number of controlled ion trap qubits could be increased by more than two orders of magnitude. Therefore, the method is excellently suited for the scaling in the cryogenic temperature range needed in quantum computing.

Embodiments provide a cryo-compatible quantum computing arrangement in which the layer element comprises a beta-modification of tungsten that is under compressive stress. Tungsten layers exhibit both the stable body-centered cubic α-phase and the metastable β-phase.

Embodiments provide a cryo-compatible quantum computer arrangement in which adjacent to the layer element with the beta-modification of the tungsten material is another layer with another material that has a higher coefficient of thermal expansion than the tungsten material. Thus, the tungsten still exhibits the beta-modification even at greater layer thicknesses.

Embodiments provide a cryo-compatible quantum computer arrangement in which, adjacent to the layer element with the beta-modification of the tungsten material, a further layer with a further material, which has a higher coefficient of thermal expansion than the tungsten material, is arranged on both sides. This means that the tungsten still comprises the beta-modification even at greater layer thicknesses.

In order to obtain the high transition temperature of the tungsten, it is advantageous if the deposited tungsten remains below a respective compressive stress, for example during the cooling process for the cryogenic temperature range of the quantum computing application. This maintains or stabilizes the metastable β-phase of the tungsten, which has a higher transition temperature than other tungsten phases, for example the stable body-centered cubic α-phase. The tungsten layer (beta tungsten layer) can be sandwiched between materials that have a higher coefficient of thermal expansion than tungsten, such as titanium nitride (TiN), tungsten disulfide ($WS_2$), platinum (Pt), palladium (Pd), nickel (Ni), aluminum (Al), and/or aluminum oxide ($Al_2O_3$).

According to another embodiment of the present invention, the method can be performed in the production process during the front-end-of-line (FEOL) processes or also during the back-end-of-line (BEOL) processes. For example, contacting can take place in the FEOL, using solid-liquid interdiffusion soldering (SLID).

The method is based on the same considerations as the device described above and can optionally be supplemented by all features, functionalities and details which are also described herein with respect to the inventive device. The method can be supplemented by said features, functionalities and details both individually and in combination.

In this respect, the inventive concept provides a cryo-compatible quantum computing arrangement at relatively low cost, which includes an improved trade-off between scaling, superconductivity temperature range, and implementation effort. Above that, the effort (and resulting cost) of testing can be kept low due to the cryogenic environment.

BRIEF DESCRIPTION OF THE DRAWINGS

Embodiments of the present invention will be detailed subsequently referring to the appended drawings, in which.

DETAILED DESCRIPTION OF THE INVENTION

Before embodiments of the present invention will be explained in detail below with reference to the drawings, it should be noted that identical, functionally equal and equal elements, objects and/or structures are provided with the same reference numbers in the different figures, so that the description of these elements shown in different embodiments is interchangeable or interapplicable.

Embodiments described below are described in connection with a variety of details. However, embodiments can be limited without these detailed features. Further, for the sake of clarity, embodiments are described using sectional views as a substitute for a detailed view. Further, details and/or features of individual embodiments can be readily combined with each other as long as it is not explicitly described to the contrary.

It is understood that when an element is described as "connected" or "coupled" to another element, the same can be directly connected or coupled to the other element or intermediate elements can be present. Conversely, when an element is described as being "directly" "connected" or "coupled" to another element, no intermediate elements are present. Other expressions used to describe the relationship between elements should be interpreted in the same way (e.g., "between" versus "directly between," "adjacent" versus "directly adjacent," etc.).

In the context of the present description, elements made of a specific material or a specific combination of materials comprise at least 90%, 95% or 99%, or even 100% of the specified material or specified combination of materials. Thus, the specified materials can have a further component or further components (materials) to the small extent specified. This can occur, for example, due to application processes, etc.

To simplify the description of the different embodiments, the figures comprise a Cartesian coordinate system x, y, z, wherein the directions x, y, z are arranged orthogonally to each other. In the embodiments, the x-y plane corresponds to the main surface area of a carrier or substrate (=reference plane=x-y plane), wherein the upward direction vertical thereto with respect to the reference plane (x-y plane) corresponds to the "+z" direction, and wherein the downward direction vertical thereto with respect to the reference plane (x-y plane) corresponds to the "−z" direction. In the following description, the term "lateral" means a direction parallel to the x and/or y direction, i.e. parallel to the x-y plane, where the term "vertical" indicates a direction parallel to the +/−z direction.

Figure 1A:
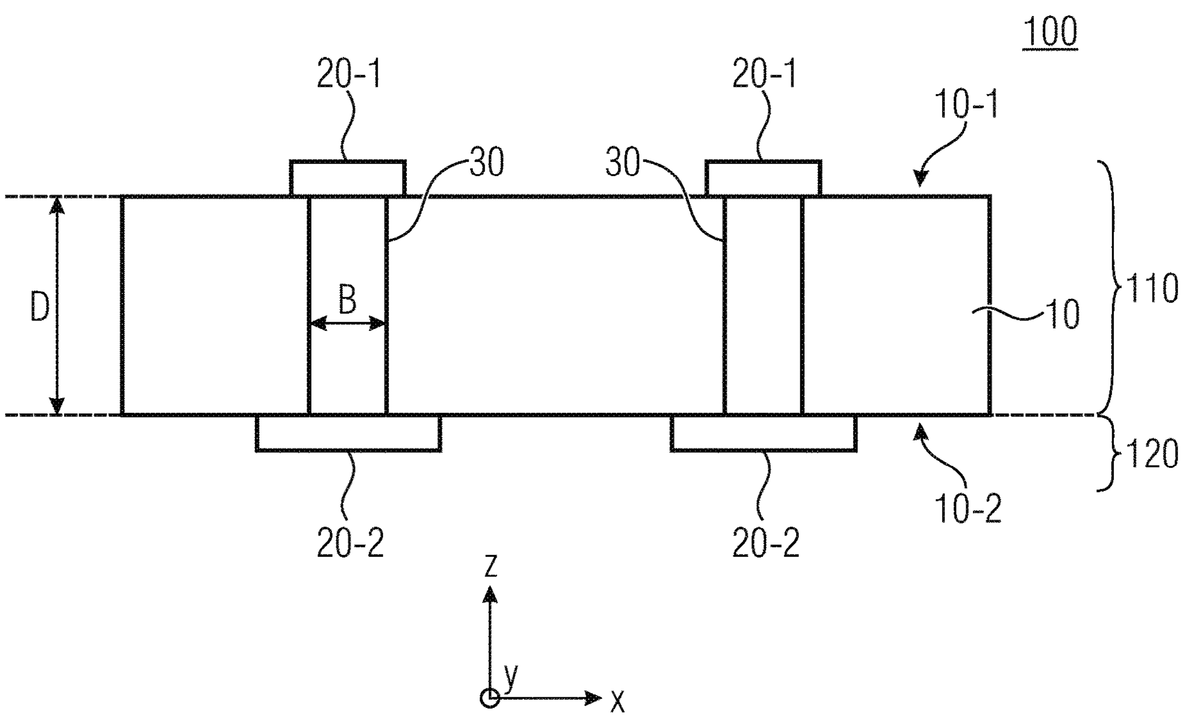
FIG. 1A is a schematic sectional view of a cryo-compatible quantum computing arrangement according to an embodiment.
Figure 1B:
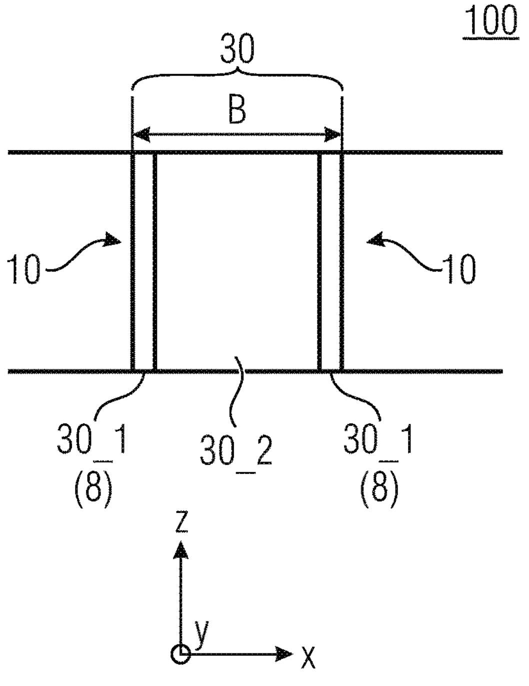
FIG. 1B is a schematic sectional view of the conductive feedthrough of the cryo-compatible quantum computing arrangement having a layer element and a filling element according to an embodiment.

FIGS. 1*a*-1*b* show a cryo-compatible quantum computing arrangement 100. The arrangement 100 includes a micro-electrical quantum computing component 110 having a substrate structure 10, a plurality of first contact elements 20-1 and a plurality of conductive feedthroughs (TSVs) 30 through the substrate structure 10. For example, the conductive feedthroughs 30 are electrically connected on a first main surface area 10-1 of the substrate structure 10 to associated first contact elements 20-1 of the microelectronic quantum computing component 110. Further, the quantum computing arrangement 100 includes a further microelectronic component 120 having a plurality of second contact elements 20-2, wherein, on a second main surface area 10-2 of the substrate structure 10, the conductive feedthroughs 30 are electrically connected to associated second contact elements 20-2 of the further microelectronic component 120. The conductive feedthroughs 30 each include, between the first contact element 20-1 and the second contact element 20-2, a layer element 30-1 comprising a first material that is superconducting at a quantum computing operating temperature, such as below 10 K, and a filling element 30-2 comprising a second material that is electrically conductive.

According to an embodiment, the filling element fills at least 50% (or at least 70, 90 or 99%) of the respective volume of the conductive feedthroughs along the cross-section between the first and second main surface areas of the substrate structure. The filling element can also completely fill the respective volume (=residual volume of the feedthroughs provided with the layer element).

According to an embodiment, the cryo-compatible quantum computing arrangement 100 is provided, for example, for controlling ion trap qubits in an ion trap chip and includes the microelectrical quantum computing component 110 comprising the substrate structure 10, the plurality of first contact elements 20-1 and the plurality of conductive feedthroughs (TSVs) 30 through the substrate structure 10. The conductive feedthroughs (TSVs) 30 are filled with, for example, a tungsten-based material to provide, for example, greater conductivity of the TSVs 30 even at higher temperatures above the superconductivity transition temperature. The TSVs 30 are arranged, for example, on a first main surface 10-1 of the substrate structure 10 such that the same are directly arranged on and electrically connected to the first contact elements 20-1 of the microelectrical quantum computing component 110. In this regard, each individual feedthrough 30 can be associated with or directly connected to a first contact element 20-1. For example, the plurality of second contact elements 20-2 of the further microelectrical component 120 can be arranged such that each feedthrough 30 is associated with or directly connected to the second contact elements 20-2 on the second main surface area 10-2. In this manner, an electrical connection or via through the substrate structure 10 can be provided so that an interconnection or interconnect is formed.

As shown in FIG. 1A, the diameter (width) of component 20-1 (corresponding to the x-axis) can differ from the diameter (width) of component 20-2. Alternatively, the diameters of components 20-1 and 20-2 can comprise a correspondingly equal dimension, or be correspondingly equal, such that, for example, the area of components 20-1 is equal to the area of TSV 30. In this way, the area of the electrical connection can be minimized so that a high integration density of the vias 30 in the substrate structure 10 can be achieved. For example, the first contact elements 20-1 can differ from the second contact elements 20-2 in shape and material, provided the same are electrically connected to the associated TSV 30. Additionally or alternatively, the contact elements 20-1 and/or 20-2 can be formed as bond bumps or bond pillars, respectively, whereby the electrical connection can be established.

As further shown in FIG. 1A, a planar substrate structure 10 and planar main surfaces 10-1 and 10-2, respectively, are used for a cryo-compatible quantum computing arrangement 100. Alternatively, a non-planar and/or step-shaped substrate structure 10 can be provided for the conductive feedthroughs 30. In some implementations, by means of step-shaped substrate structure 10, the thickness "D" of substrate structure 10 (=vertical extension of the conductive feedthroughs 30) can be configured differently (corresponding to the z-axis), although this is not mandatory.

For example, the conductive feedthroughs (TSVs) 30 have a diameter B in the range of 0.8 μm to 1.5 μm. Further, the TSVs can have a minimum TSV spacing from each other that ranges from 1.6 μm to 3 μm. For example, the TSV depth into the substrate can be at least 6 μm to 10 μm. Further, the conductive feedthrough can have an aspect ratio of 10:1 to 20:1 to achieve the highest possible integration density in the substrate so that the high wiring density can control a high number of the qubits.

The interconnections or interconnects are produced, for example, by means of a cryo-compatible intermetallic bonding method with very high integration density, by metal interdiffusion methods, e.g. based on the metal system Nb/TiN/Au. In particular, this approach enables scalability of the bonding arrangements in quantum computing applications, since by means of application-optimized interconnection technology in combination with tungsten TSVs, e.g. the number of controlled ion trap qubits can be increased by several orders of magnitude (essentially arbitrarily).

For example, the contact connection between the contact elements 20-1 of the microelectronic quantum computing component 110 can comprise a cryo-compatible interdiffusion metallic connection. According to an embodiment, interdiffusion metallic connections can additionally or alternatively comprise, on the first main surface area 10-1 of the substrate structure 10 with the contact elements 20-2 of the further microelectronic component 120. The interdiffusion metallic connections on the first main surface area 10-1 and at the contact connections between the contact elements 20-1 enable the realization of a high integration density of the conductive feedthroughs 30 in the substrate structure 10 of the quantum computing microelectronic component 100 to increase the number of ion trap qubits to be controlled.

According to an embodiment, for example, the contact elements 20-1 of the microelectronic quantum computing component 110 are connected to a plurality of conductive feedthroughs 30 in a parallel circuit.

According to an embodiment, the plurality of conductive feedthroughs 30 are electrically insulated from the substrate structure 10, for example, by means of an insulation material 34.

According to an embodiment, for example, the filling element completely fills each of the conductive feedthroughs 30 with a tungsten material.

According to an embodiment of the present invention, the layer element can have a beta-modification of tungsten, wherein the filling element comprises an electrically conductive material, such as tungsten or a tungsten-based material or another electrically conductive material. According to another embodiment, for example, the layer element comprises a beta-modification of tungsten, wherein the filling element comprises a tungsten material.

According to an embodiment, in order to maintain the beta-modification of the tungsten of the layer element, for example, the tungsten is arranged as a layer 30-1 in the conductive feedthroughs 30 of the substrate 10, wherein another layer 5; 7 with another material having a higher coefficient of thermal expansion than the tungsten material is arranged adjacent to the layer element of the beta tungsten material 30-1.

According to an embodiment, for example, another layer 5; 7 with another material having a higher coefficient of thermal expansion than the tungsten material is arranged adjacent to the layer element comprising the beta-modification of the tungsten material 30-1.

According to an embodiment, adjacent to the layer element with the beta-modification of the tungsten material 30-1, for example, a further layer 5; 7 with a further material is arranged on both sides, each of which comprise a higher coefficient of thermal expansion than the tungsten material.

As already explained, the at least partial or even complete filling of the TSVs with tungsten also increases the conductivity of the TSVs at already higher temperatures above the superconductivity transition temperature. Titanium nitride has a significantly poorer conductivity in this temperature range. Thus, the superconductivity of TSVs can be achieved in the temperature range of quantum computing application temperatures from 10-1000 mK. Further, a functional test of the tungsten-filled or lined feedthroughs (TSVs) of the cryo-compatible quantum computing arrangement can be reliably performed at temperatures around 70° K (nitrogen temperature) before using the interconnects or rewiring at the application temperatures below the superconductivity. This simplifies the expensive, time-consuming testing and thus significantly reduces the production cost of the ion trap chip. Further, the cryo-compatible quantum computing arrangement can already be tested at the wafer level, for example die-on-chip wafer, and then subsequently be used operably at the cryogenic temperatures of the quantum computing application. This eliminates the need for expensive testing in dedicated cryo-test systems at temperatures below superconductivity. In other words, the costly cooling using helium, for example helium-3 or for example helium-4, for the cryogenic temperature range below the superconductivity transition temperature can be prevented.

FIG. 1B shows a schematic cross-sectional view of the conductive feedthrough 30 having a layer element 30-1 and a filling element 30-2 according to an embodiment. For example, the filling element 30-2 can fill at least 50% of the respective volume of the conductive feedthroughs 30 along the cross-section between the first main surface area 10-1 and the second main surface area 10-2 of the substrate structure 10. As already shown in FIG. 1A, the conductive feedthroughs 30 each extend between the first and second contact elements and extend throughout the entire substrate structure 10 as previously explained. For example, the layer element 30-1 can comprise a first material that is superconducting at a quantum computer operating temperature, i.e., in the operating mode of the quantum computing arrangement. The filling element 30-2 comprises an electrically conductive material or alloy, such as tungsten, niobium (Ni), tantalum (Ta), titanium nitride (TiN), platinum (Pt), palladium (Pd), nickel (Ni), copper (Cu), aluminum (Al), titanium (Ti), or lead (Pb), or an electrically conductive alloy. This list is not to be considered as exhaustive.

The layer element 30-1 of the TSVs 30, which is superconducting at cryogenic temperatures, can be, for example, tungsten layers with beta structure or sandwich structures of thin tungsten and other thin layers of cryo-compatible materials to realize the superconductivity at the application temperatures of the quantum computer (10-1000 mK range) in helium or helium-mix cryostats.

For example, the layer element 30-1 (without any other adjacent layer or layers) can comprise one or more of the following superconducting materials: tungsten, technetium, tantalum, niobium, $Nb_3Ge$, MoN, $MgB_2$, $K_3C_{60}$, gallium, lead, AuPb, aluminum, (and the following metallic nitrides) TiN, ZrN, HfN, VN, NbN, TaN, MoN, WN. Of these, NbN has the highest transition temperature $T_c$~17K, while TiN has a transition temperature $T_c$~4.8K.

In a layer stack 8 comprising the layer element 30-1 and a further adjacent layer or layers, the layer element can comprise, e.g., tungsten with an adjacent titanium nitride layer (as the further layer) or be arranged between titanium nitride layers (as the further layers). Further, the layer stack can also have niobium (as the layer element) with an adjacent titanium nitride layer (as the further layer) or be arranged between titanium nitride layers (as the further layers) or comprise tantalum (as the layer element) with an adjacent titanium nitride layer (as the further layer) or be arranged between titanium nitride layers (as the further layers). For example, the further layer(s) can also include tungsten disulfide (WS2), platinum (Pt), palladium (Pd), nickel (Ni), aluminum (Al), and/or aluminum oxide (Al2O3) in addition to (=instead of) titanium nitride (TiN).

According to an embodiment, the layer element 30-1 or the layer stack 8 with the layer element 30-1 can cover a part of the wall area or the entire wall area of the feedthrough 30 as a layer, while the filling element 30-2 fills the remaining volume of the feedthrough 30 at least partially (at least 50%) or even completely. Thus, the layer element 30-1 or the layer stack can partially or in areas (or laterally completely) enclose the filling element 30-2 between the first contact element 20-1 and the second contact element 20-2, wherein both the layer element 30-1 and the filling element 30-2 extend from the first contact element 20-1 to the second contact element 20-2 and connect the same. According to another embodiment, the layer element 30-1 or the layer stack comprising the layer element can completely cover the wall area of the feedthrough 30 as a layer, while the filling element 30-2 fills the remaining volume of the feedthrough 30 at least partially (at least 50%) or also completely. The layer element 30-1 can also completely surround the filling element 30-2 (e.g., in the form of a cladding), wherein also both the layer element 30-1 and the filling element 30-2 extend from the first contact element 20-1 to the second contact element 20-2 and connect the same.

Figure 2:
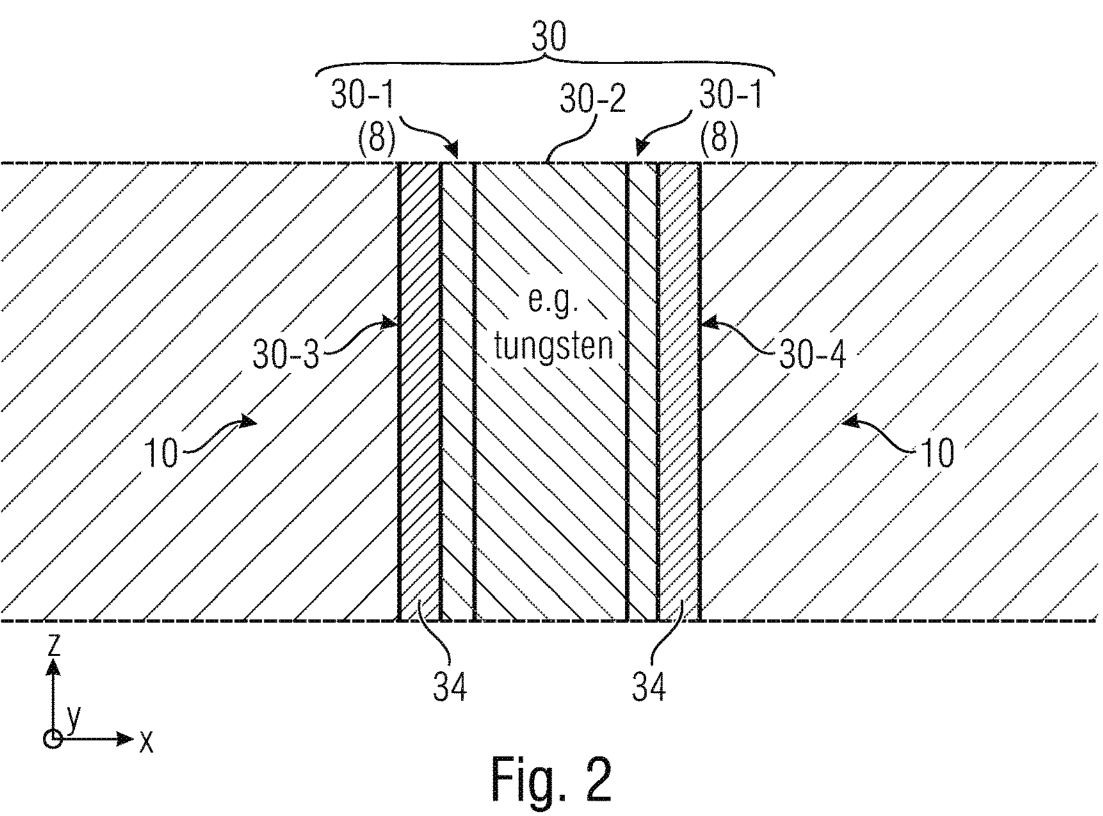
FIG. 2 is a schematic sectional view of a conductive feedthrough having an insulating material and a tungsten material according to an embodiment.

FIG. 2 shows a schematic sectional view of a TSV 30 formed continuously in the substrate structure 10. According to an embodiment, the TSVs 30 can be electrically insulated from the substrate structure 10 by means of an insulating material 34 or an insulating layer on the sidewalls 30-3 and 30-4 of the feedthroughs 30, and can be at least partially or completely filled with the filling element 30-2 and the layer element 30-1. For example, FIG. 2 illustrates the insulated conductive feedthrough 30 being completely filled with a tungsten material. For example, the insulating material 34 can include silica, glass, plastic, and/or titanium nitride. By means of the insulating material 34 on the sidewalls 30-3 and 30-4 of the feedthrough 30, electrical isolation can be enabled so that the electrically conductive connection from the first contact elements 20-1 to the second contact elements 20-2 can be provided. For example, the contact elements 20-1 of the microelectrical quantum computing component 110 can be connected to a plurality of TSVs 30 in a parallel circuit, for example for resistance reduction. In this regard, embodiments further provide that the filling element 30-2 or the layer element 30-1 is arranged directly adjacent to the insulating layer 34. Further, it is possible that, for example, TSVs that can be connected in parallel, either in areas or individually, can be connected (interconnected), such as by providing an area, row, or array, e.g., n×m with n≥2 and m≥2 and n, m are integers, such as 2×2, 3×3, 4×4, or 5×5, etc., of TSVs connected in parallel.

Figure 3:
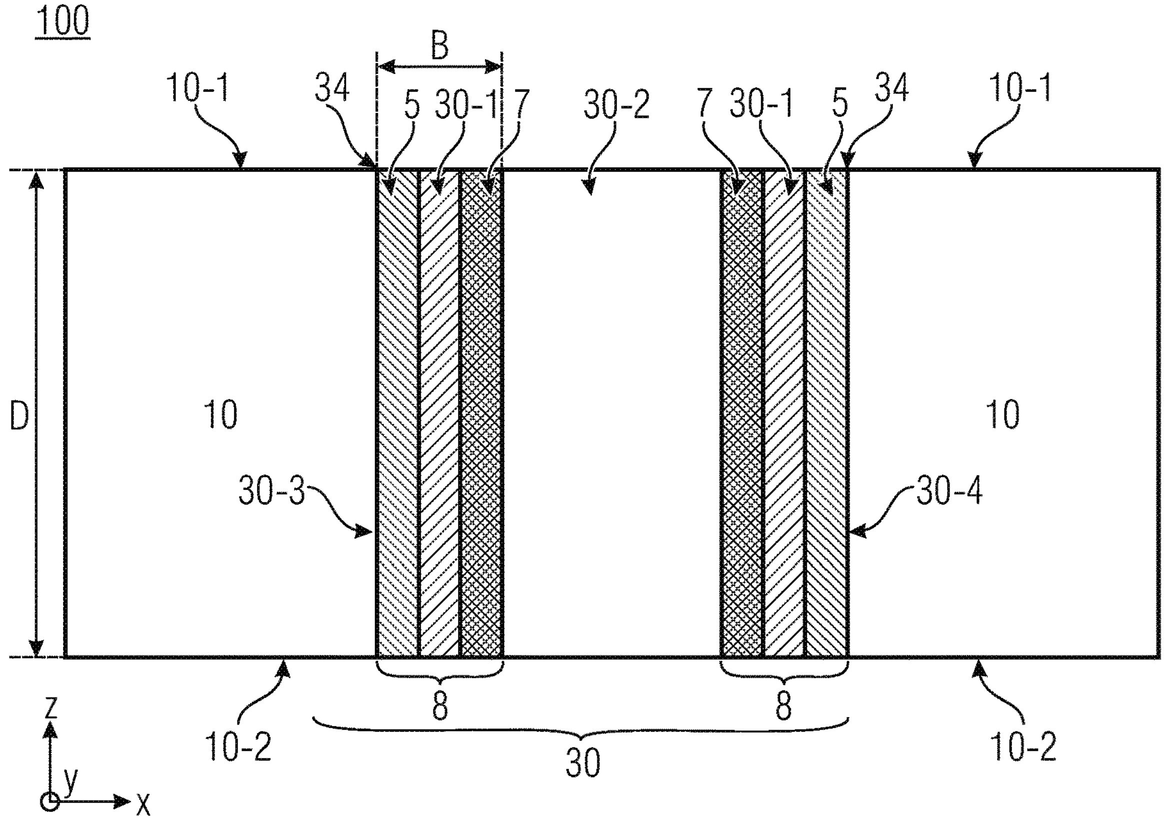
FIG. 3 is a schematic sectional view of a conductive feedthrough having a layer stack each on the side walls according to an embodiment.

FIG. 3 shows a schematic sectional view of a cryo-compatible quantum computing arrangement according to an embodiment with a layer stack 8 on the side walls 30-3 and 30-4 of the TSVs 30. Here, the layer stack 8 comprises the layer element 30-1 and the further adjacent layers 5, 7. The tungsten material can have different structures or phases by means of the inventive method, temperature and application. As explained earlier, the tungsten phases (alpha phase and beta phase) have different transition temperatures. In other words, tungsten in the alpha phase or alpha structure has a lower transition temperature than the beta structure or beta phase of tungsten. In order to minimize the implementation effort, the beta structure (beta phase) of tungsten is advantageous compared to the alpha tungsten, so that the highest possible transition temperature of tungsten is obtained. Thus, the superconductivity of the TSVs can be obtained in the temperature range of the application temperatures of quantum computing from 10-1000 mK. Further, a functional test of the tungsten-based material filled feedthroughs (TSVs) of the cryo-compatible quantum computing arrangement can be reliably performed at temperatures around 70° K (nitrogen temperature).

According to embodiments, to obtain the high transition temperature of the tungsten, the tungsten is kept under compressive stress during the cooling process, i.e. the cooling-down operation. Thus, the beta phase of the tungsten can be obtained, which has a higher transition temperature than other tungsten phases. Therefore, the tungsten layer 30-1 is embedded between another layer 5 and 7 of another material, which has a higher coefficient of thermal expansion than the tungsten material 30-1.

As shown in FIG. 3, the tungsten layer 30-1 is embedded between the further layer 5 having a higher coefficient of thermal expansion than tungsten and the further layer 7 having a higher coefficient of thermal expansion than tungsten to form, for example, a sandwich layer stack 8. In this way, the layer stack 8 can be deposited layer by layer to the insulating layer 34 using a deposition process such as the tungsten vapor deposition process. As explained above, the further layer 5, the further layer 7 or both further layers 5 and 7 can comprise titanium nitride (TiN), tungsten disulfide ($WS_2$), platinum (Pt), palladium (Pd), nickel (Ni), aluminum (Al) and/or aluminum oxide ($Al_2O_3$).

Thus, in a layer stack 8 having the layer element 30-1 and a further adjacent layer 5 or layers 5, 7, the layer element 30-1 can, for example, have tungsten with an adjacent titanium nitride layer (as the further layer 5 or 7) or can be arranged between titanium nitride layers (as the further layers 5 and 7). Further, the layer stack 8 can also comprise niobium (as the layer element 30-1) with an adjacent titanium nitride layer (as the further layer 5 or 7) or be arranged between titanium nitride layers (as the further layers 5 and 7) or can comprise tantalum (as the layer element 30-1) with an adjacent titanium nitride layer (as the further layer 5 or 7) or can be arranged between titanium nitride layers (as the further layers 5 and 7). For example, the further layer 5 or 7 or the further layers 5 and 7 can also comprise tungsten disulfide (WS2), platinum (Pt), palladium (Pd), nickel (Ni), aluminum (Al) and/or aluminum oxide (Al2O3) in addition to (=instead of) titanium nitride (TiN).

Figure 4:
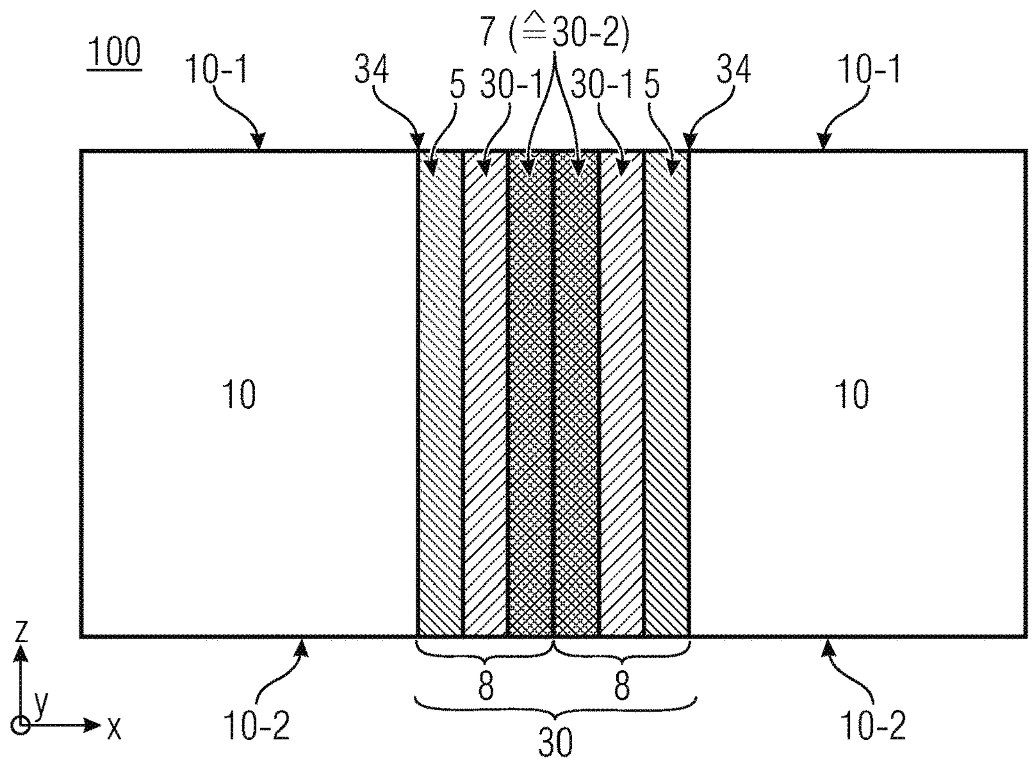
FIG. 4 is a schematic sectional view of a conductive feedthrough having mutually connected layer stacks according to an embodiment.

FIG. 4 illustrates a cryo-compatible quantum computing arrangement according to a further embodiment with two layer stacks 8 side by side, which are directly connected to each other, for example. As already shown in FIG. 5, the quantum computing arrangement comprises a substrate structure 10, an insulation material 34 in the TSV 30, or between the substrate structure 10 and the further layer 5, and a layer element 30-1 (e.g. a tungsten layer etc.) 6. In contrast to the layer stacks 8 shown in FIG. 3, embodiments in this case further provide for the layer stacks 8 to be directly connected to one another. For example, the layer stack 8 can cover the wall area of the feedthrough 30 such that the feedthrough is (e.g., completely) filled. As shown in FIG. 4, the further layer 7 in the TSV 30 can contain two corresponding layers. Additionally or alternatively, the material of the layer 7 can have a correspondingly thick layer to form the filling element 30-2, or for example like the layer thicknesses of the further layer 5 and/or the layer element 30-1 (e.g., the tungsten layer), wherein this is only exemplary.

Figure 5:
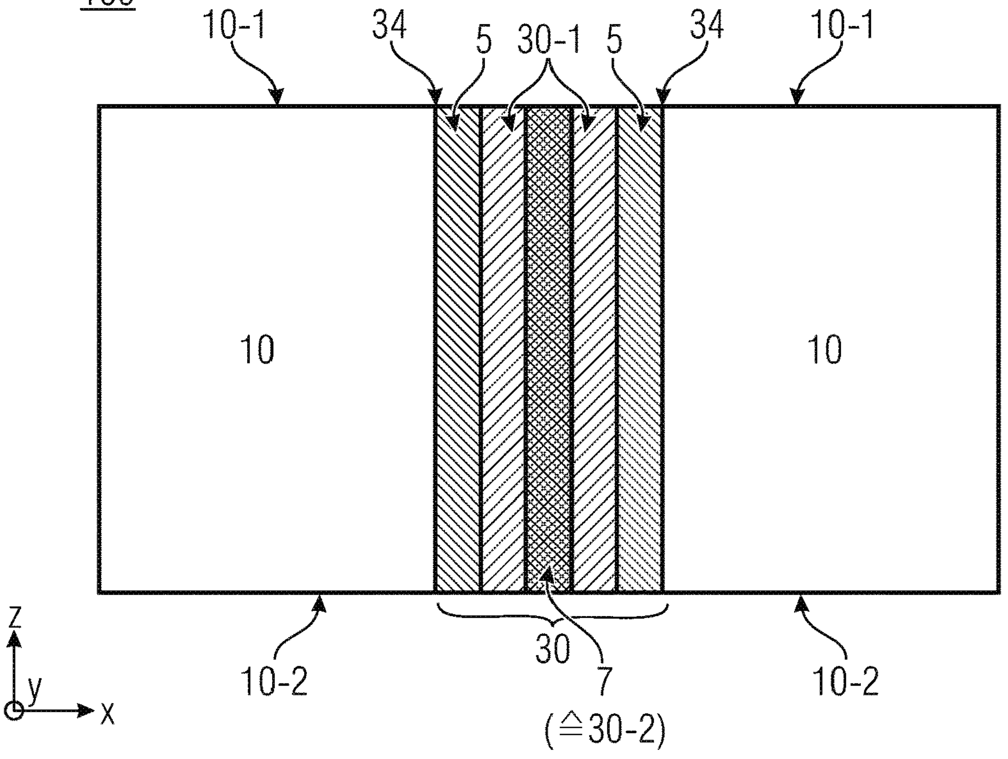
FIG. 5 is a schematic sectional view of a conductive feedthrough having a further configuration of a layer stack according to an embodiment.

Further, embodiments allow a quantum computing arrangement according to an embodiment to comprise only one further layer 7. In contrast to the illustration in FIG. 4, the embodiment in FIG. 5 shows a quantum computing arrangement with only a single further layer 7 (corresponding, for example, to the filling element 30-2), which has a higher coefficient of thermal expansion than tungsten. In addition, it is possible to deposit the respective layers 34, 5, 30-1 and 7 such that the tungsten layer 30-1 comprises as much of the material of the conductive feedthrough 30 as possible, for example in the range of 50% to 99% or 60% to 90% or 70% to 80%.

Thereby, the electrical characteristic of the electrical connection can be defined, such as by dimensioning the tungsten layer 30-1 to meet quantum computing requirements.

The layers 5, 7, 30-1, 30-2, 34 etc. shown in FIG. 5 can accordingly also comprise the materials or material combinations described on the basis of FIG. 4.

The quantum computing arrangement allows a particularly easy producibility of a three-dimensional structure for controlling ion trap qubits in an ion trap chip, since on the one hand the microelectronic components can be tested at cryogenic temperatures before use and on the other hand a high integration density of the TSVs based on metal interdiffusion techniques is obtained to control as many ion trap qubits as possible.

Figure 6:
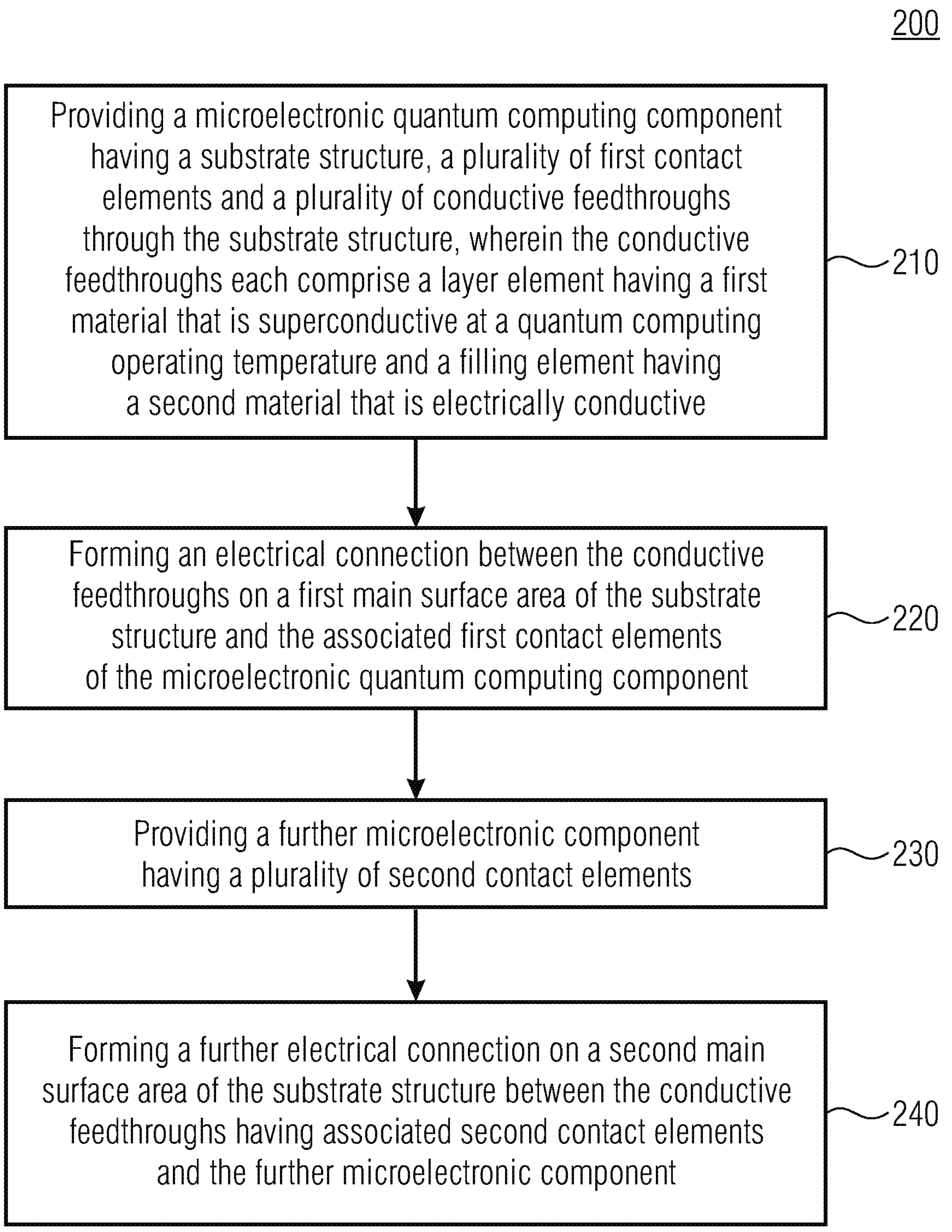
FIG. 6 is an exemplary basic flow diagram of the inventive production process according to an embodiment.

FIG. 6 shows a method 200 for producing a cryo-compatible arrangement according to an embodiment. The method comprises providing 210 a microelectronic quantum computing component having a substrate structure, a plurality of first contact elements and a plurality of conductive feedthroughs through the substrate structure, wherein the conductive feedthroughs each comprise a layer element having a first material that is superconducting at a quantum computing operating temperature and a filling element having a second material that is electrically conductive. Further, the method comprises forming 220 an electrical connection between the conductive feedthroughs on a first main surface area of the substrate structure and the associated first contact elements of the quantum computing microelectronic component and providing 230 a further microelectronic component having a plurality of second contact elements. Further, the method comprises forming 240 a further electrical connection on a second main surface area of the substrate structure between the conductive feedthroughs having associated second contact elements and the further microelectronic component.

According to embodiments, the step 210 of providing the conductive feedthroughs comprises, for example, depositing 250 the tungsten material of the layer element under compressive stress into feedthroughs to obtain beta-modification of the tungsten material and at least partially or completely filling 260 the feedthroughs with a tungsten material to obtain the conductive feedthroughs.

Further, the method comprises, for example, arranging 270 a further layer comprising a material with a higher coefficient of thermal expansion than the tungsten material adjacent to the layer element having the beta-modification of the tungsten material.

Further, the method includes, for example, arranging 280 a further layer on either side comprising a material with a higher coefficient of thermal expansion than the tungsten material adjacent to the layer element having the beta-modification of the tungsten material.

The TSVs are completely filled by tungsten gas phase deposition, e.g. by tungsten hexafluoride and hydrogen gas. The complete filling of the TSVs advantageously realizes higher conductivity of the TSVs at already higher temperatures above the superconductivity transition temperature compared to TiN wetted TSVs. This significantly eases the testability of the integrated microelectronic components before the same are used at the application temperatures below the superconductivity. This significantly simplifies the usually cost-intensive testing and thus substantially lowers the production costs of the integrated quantum chip system. Further, the systems (quantum chips) can be tested already at wafer level (or die-on-wafer) without any limitation of generality and can be built according to usual known-good-die strategy and then be used functionally at the cryogenic temperatures of the quantum computing applications. Thus, advantageously, the very cost-intensive testing in special cryo-test systems at temperatures below superconductivity is not needed.

In order to achieve the highest possible transition temperature of tungsten, it is advantageous if the deposited tungsten remains under compressive stress during the cooling process of the system. Thereby, the β-phase of tungsten is obtained, which has a higher transition temperature than other tungsten phases. For this purpose, it is advantageous if the tungsten layer is embedded between a material that has a higher coefficient of thermal expansion than tungsten, for example titanium nitride (TiN), tungsten disulfide ($WS_2$), platinum (Pt), palladium (Pd), nickel (Ni), aluminum (Al) and/or aluminum oxide ($Al_2O_3$).

Although some aspects of the present disclosure have been described as features in the context of an apparatus, it is obvious that such a description can also be considered as a description of corresponding method features. Although some aspects have been described as features related to a method, it is obvious that such a description can also be considered as a description of corresponding features of an apparatus or functionality of an apparatus.

In the preceding detailed description, various features have been grouped together in examples in part to streamline the disclosure. This type of disclosure should not be interpreted as an intent that the claimed examples comprise more features than are explicitly stated in each claim. Rather, as the following claims reflect, the subject matter can be found in fewer than all of the features of a single disclosed example. Consequently, the following claims are hereby incorporated into the detailed description, and each claim can stand as its own separate example. While each claim can stand as its own separate example, it should be noted that although dependent claims in the claims relate to a specific combination with one or more other claims, other examples also include a combination of dependent claims with the subject matter of any other dependent claim or a combination of any feature with other dependent or independent claims. Such combinations are said to be encompassed unless it is stated that a specific combination is not intended. It is further intended that a combination of features of a claim with any other independent claim is also encompassed, even if that claim is not directly dependent on the independent claim.

While this invention has been described in terms of several advantageous embodiments, there are alterations, permutations, and equivalents, which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

REFERENCES

EP 2 876 435 B1

U.S. Pat. No. 6,548,391

Tao et al., "3D Integration of CMOS-Compatible Surface Electrode Ion Trap and Silicon Photonics for Scalable Quantum Computing," 2019 IEEE 69th Electronic Components and Technology Conference (ECTC), Las Vegas, NV, USA, 2019, pp. 1735-1743, doi: 10.1109/ECTC.2019.00266

Yost et al., "Solid-state qubits integrated with superconducting through-silicon vias", npj Quantum Information (2020) 59

K. Grigoras et al., "Superconducting TiN through-silicon-vias for quantum technology; IEEE 2019 21st Electronics Packaging Technology Conference"

LITA et al.: Tuning of Tungsten Thin Film Superconducting Transition Temperature for Fabrication of Photon Number Resolving Detectors; IEEE TRANSACTIONS ON APPLIED SUPERCONDUCTIVITY, VOL. 15, NO. 2, JUNE 2005

The invention claimed is:

1. A cryo-compatible quantum computing arrangement, comprising:

a microelectronic quantum computing component comprising:

a substrate structure, a plurality of first contact elements and a plurality of conductive feedthroughs through the substrate structure, wherein the conductive feedthroughs on a first main surface area of the substrate structure are electrically connected to associated first contact elements of the microelectronic quantum computing component, and a further microelectronic component comprising a plurality of second contact elements, wherein, on a second main surface area of the substrate structure, the conductive feedthroughs are electrically connected to associated second contact elements of the further microelectronic component, and wherein the conductive feedthroughs each comprise, between the first contact element and the second contact element, a layer element comprising a first material that is superconducting at a quantum computer operating temperature below a superconductivity transition temperature and a filling element comprising a second material that is electrically conductive above the superconductivity transition temperature.

2. The arrangement according to claim 1, wherein the layer element covers part of the wall area of the feedthrough as a layer, and wherein the filling element at least partially fills the remaining volume of the feedthrough.

3. The arrangement according to claim 1, wherein the layer element at least partially encloses the filling element between the first contact element and the second contact element, wherein both the layer element and the filling element extend from the first contact element to the second contact element and connect the same.

4. The arrangement according to claim 1, wherein the layer element completely covers the wall area of the feedthrough as a layer, while the filling element at least partially fills the remaining volume of the feedthrough.

5. The arrangement according to claim 1, wherein the layer element encloses the filling element completely or in a cladding-shape, wherein both the layer element and the filling element extend from the first contact element to the second contact element and connect the same.

6. The arrangement according to claim 1, wherein the filling element fills at least 50% of the respective volume of the conductive feedthroughs along the cross-section between the first main surface area and second main surface area of the substrate structure.

7. The arrangement according to claim 1, wherein the contact elements are formed as bond bumps or bond pillars.

8. The arrangement according to claim 1, wherein the contact connection between the contact elements of the microelectronic quantum computing component comprises a cryo-compatible connection produced by a metal interdiffusion method.

9. The arrangement according to claim 1, wherein the contact elements on the first main surface area of the substrate structure comprise connections to the contact elements of the further microelectronic component produced by a metal interdiffusion method.

10. The arrangement according to claim 1, wherein the contact elements of the microelectronic quantum computing component are connected to a plurality of conductive feedthroughs in a parallel circuit.

11. The arrangement according to claim 1, wherein the plurality of conductive feedthroughs are electrically insulated from the substrate structure by means of an insulation material.

12. The arrangement according to claim 1, wherein the filling element completely fills each of the conductive feedthroughs with a tungsten material.

13. The arrangement according to claim 1, wherein the layer element comprises a beta-modification of tungsten.

14. The arrangement according to claim 13, wherein the filling element comprises a tungsten material.

15. The arrangement according to claim 13, wherein, in order to achieve the beta-modification of the tungsten of the layer element, the tungsten is arranged as a layer in the conductive feedthroughs of the substrate, wherein adjacent to the layer element with the beta-modification of the tungsten material, a further layer of a further material comprising a higher coefficient of thermal expansion than the tungsten material is arranged.

16. The arrangement according to claim 13, wherein adjacent to the layer element comprising the beta-modification of the tungsten material, a further layer comprising a further material comprising a higher coefficient of thermal expansion than the tungsten material is arranged.

17. The arrangement according to claim 16, wherein adjacent to the layer element comprising the beta-modification of the tungsten material, a further layer comprising a further material is arranged on either side, which in each case comprises a higher coefficient of thermal expansion than the tungsten material.

18. A method for providing a cryo-compatible quantum computing arrangement, the method comprising:

providing a microelectronic quantum computing component comprising a substrate structure, a plurality of first contact elements and a plurality of conductive feedthroughs through the substrate structure, wherein the conductive feedthroughs each comprise a layer element comprising a first material that is superconducting at a quantum computing operating temperature below a superconductivity transition temperature and a filling element comprising a second material that is electrically conductive above the superconductivity transition temperature, forming an electrical connection between the conductive feedthroughs on a first main surface area of the substrate structure and the associated first contact elements of the microelectronic quantum computing component, providing a further microelectronic component comprising a plurality of second contact elements, and forming a further electrical connection on a second main surface area of the substrate structure between the conductive feedthroughs with associated second contact elements and the further microelectronic component.

19. The method according to claim 18, wherein providing the conductive feedthroughs comprises:

depositing the tungsten material of the layer element under compressive stress in feedthroughs to achieve beta-modification of a tungsten material; and at least partially or completely filling the feedthroughs with electrically conductive material to achieve the conductive feedthroughs.

20. The method according to claim 19, wherein the feedthroughs are at least partially or completely filled with a tungsten material to achieve the conductive feedthroughs.

21. The method according to claim 20, further comprising:

arranging a further layer comprising a material comprising a higher coefficient of thermal expansion than the tungsten material adjacent to the layer element comprising the beta-modification of the tungsten material.

22. The method according to 19, further comprising:

arranging on either side a further layer of a material comprising a higher coefficient of thermal expansion than the tungsten material adjacent to the layer element comprising the beta-modification of the tungsten material.

23. Cryo-compatible quantum computing arrangement, comprising:

a microelectronic quantum computing component comprising:

a substrate structure, a plurality of first contact elements and a plurality of conductive feedthroughs through the substrate structure, wherein the conductive feedthroughs on a first main surface area of the substrate structure are electrically connected to associated first contact elements of the microelectronic quantum computing component, and a further microelectronic component comprising a plurality of second contact elements, wherein, on a second main surface area of the substrate structure, the conductive feedthroughs are electrically connected to associated second contact elements of the further microelectronic component, and wherein the conductive feedthroughs each comprise, between the first contact element and the second contact element, a layer element comprising a beta-modification of tungsten that is superconducting at a quantum computer operating temperature below the superconductivity transition temperature and a filling element comprising a tungsten material that is electrically conductive above the superconductivity transition temperature.

* * * * *